United States Patent [19]

Houston

[11] Patent Number: 5,436,173
[45] Date of Patent: Jul. 25, 1995

[54] METHOD FOR FORMING A SEMICONDUCTOR ON INSULATOR DEVICE

[75] Inventor: Theodore W. Houston, Richardson, Tex.

[73] Assignee: Texas Instruments Incorporated, Dallas, Tex.

[21] Appl. No.: 753

[22] Filed: Jan. 4, 1993

[51] Int. Cl.⁶ .......................................... H01L 21/265
[52] U.S. Cl. ........................................ 437/21; 437/86; 437/974; 437/180; 148/DIG. 12; 148/DIG. 50; 148/DIG. 135; 257/502; 257/508
[58] Field of Search ............ 148/DIG. 12, DIG. 135, 148/DIG. 50; 437/62, 86, 974, 21, 180; 156/630; 257/502, 508

[56] References Cited

U.S. PATENT DOCUMENTS

| 4,624,047 | 11/1986 | Tani | 29/576 W |
|---|---|---|---|
| 4,783,421 | 11/1988 | Carlson et al. | 437/4 |
| 4,784,970 | 11/1988 | Solomon | 437/51 |
| 5,051,378 | 9/1991 | Yagi et al. | 437/225 |
| 5,072,287 | 12/1991 | Nakagawa et al. | 357/50 |
| 5,091,330 | 2/1992 | Cambou et al. | 437/62 |
| 5,192,714 | 3/1993 | Suguro et al. | 437/62 |
| 5,238,865 | 8/1993 | Eguchi | 437/62 |
| 5,244,817 | 9/1993 | Hawkins et al. | 437/2 |
| 5,260,233 | 11/1993 | Buti et al. | 437/195 |

FOREIGN PATENT DOCUMENTS 2-49953 2/1990 Japan.
3-232239 10/1991 Japan.

OTHER PUBLICATIONS

Terada, et al., "A New DRAM Cell with a Transistor on a Lateral Epitaxial Silicon Layer (TOLE Cell)", IEEE Transactions on Electron Devices, vol. 37, No. 9. Sep. 1990, pp. 2052-2057.

Kasama, et al., "A Radiation-Hard Insulator for MOS LSI Device Isolation", IEEE Transactions on Nuclear Science, vol. NS-32, No. 6, Dec. 1985, pp. 3965-3970.

Primary Examiner—George Fourson
Assistant Examiner—David Mason
Attorney, Agent, or Firm—Jacqueline J. Garner; Richard L. Donaldson; William E. Hiller

[57] ABSTRACT

A method for forming a semiconductor on insulator device is provided that begins with an outer semiconductor layer (16). Trenches (12) of a predetermined depth are formed in outer semiconductor layer (16). An insulator layer (20) is formed outwardly from outer semiconductor layer (16). A mesa (18a) having a predetermined thickness is formed by removing portions of outer semiconductor layer (16) to expose a working surface such that mesa (18a) has a thickness substantially equal to the predetermined depth of the trenches (12) after the working surface is exposed.

37 Claims, 8 Drawing Sheets

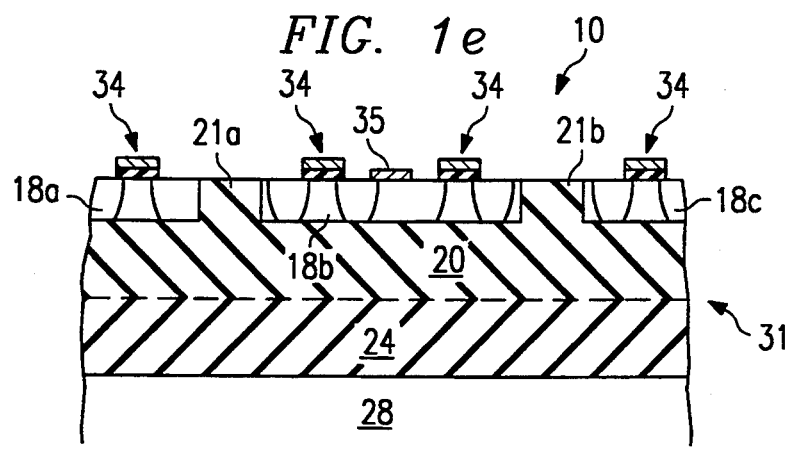
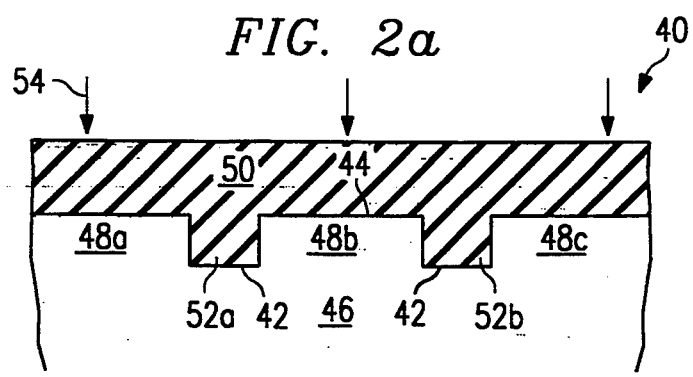
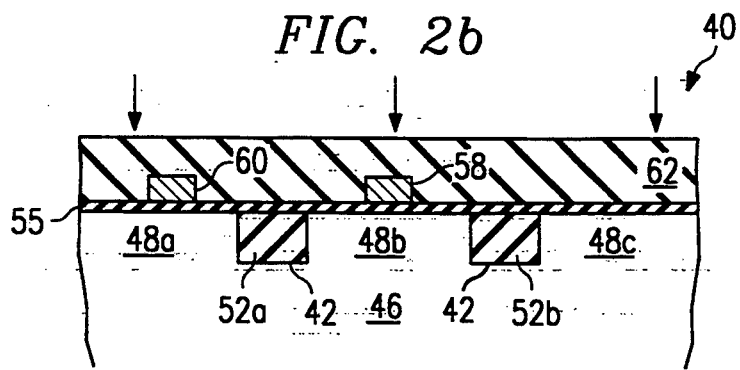
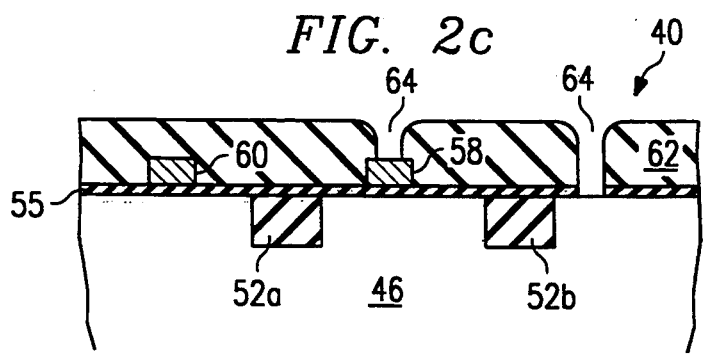

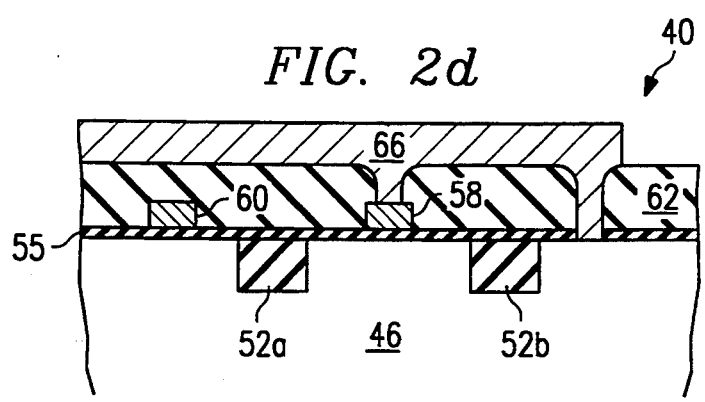
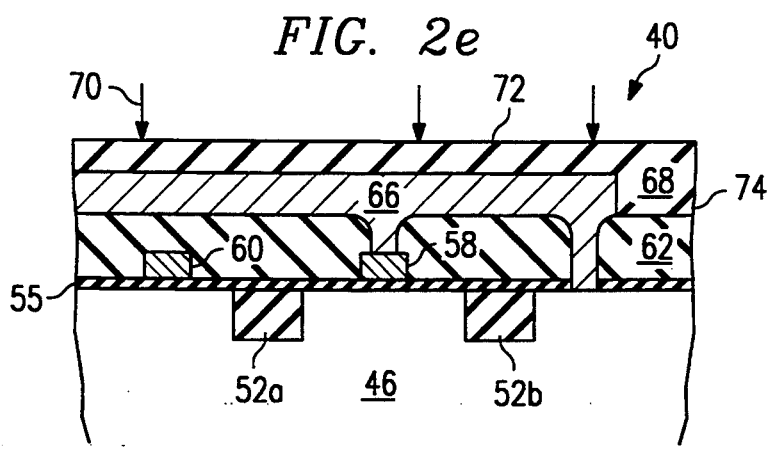
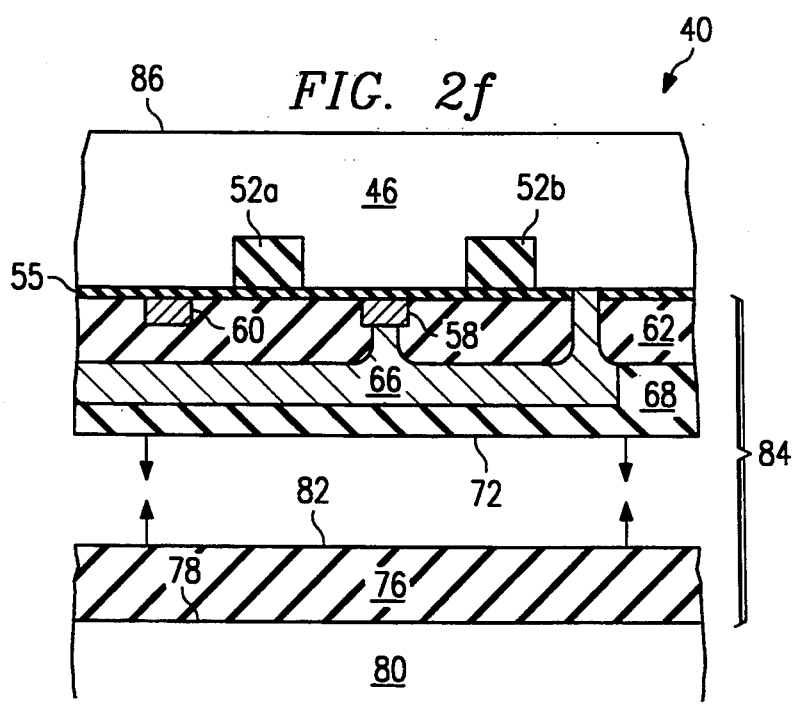

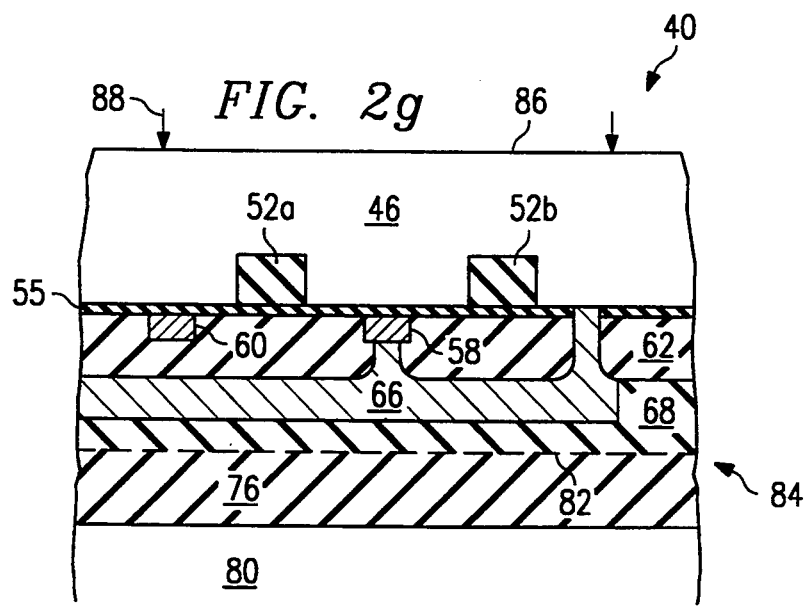
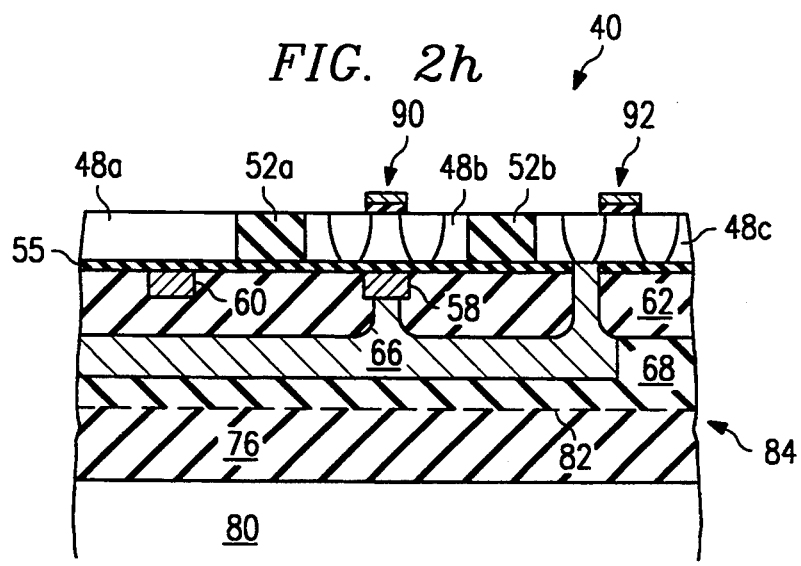
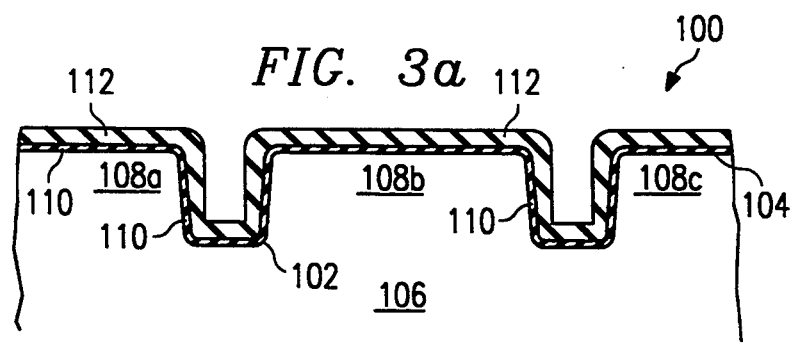

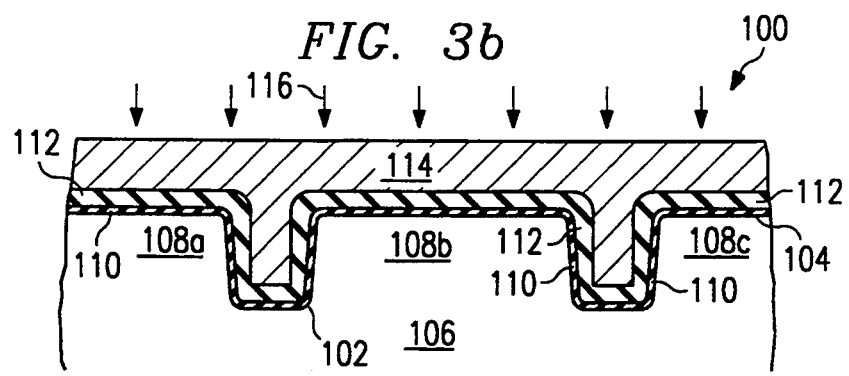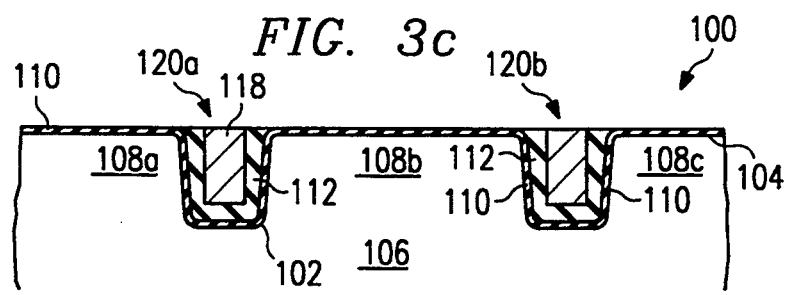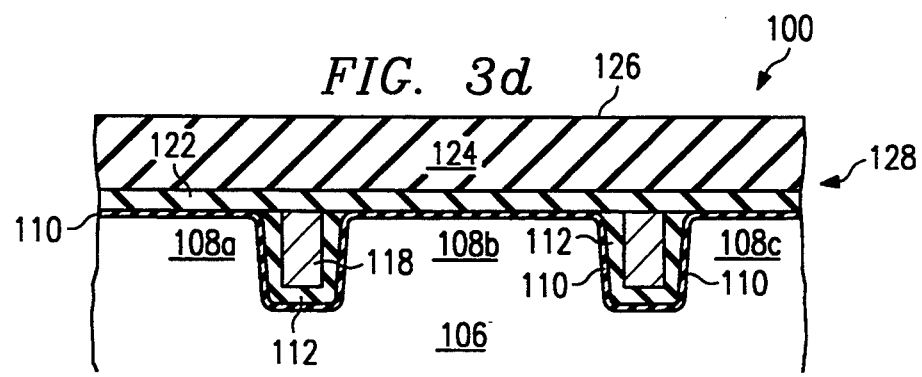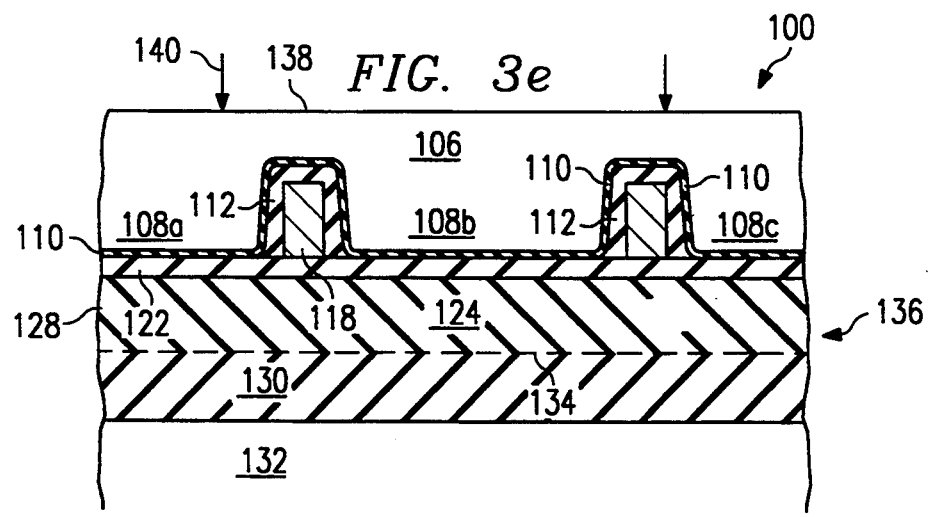

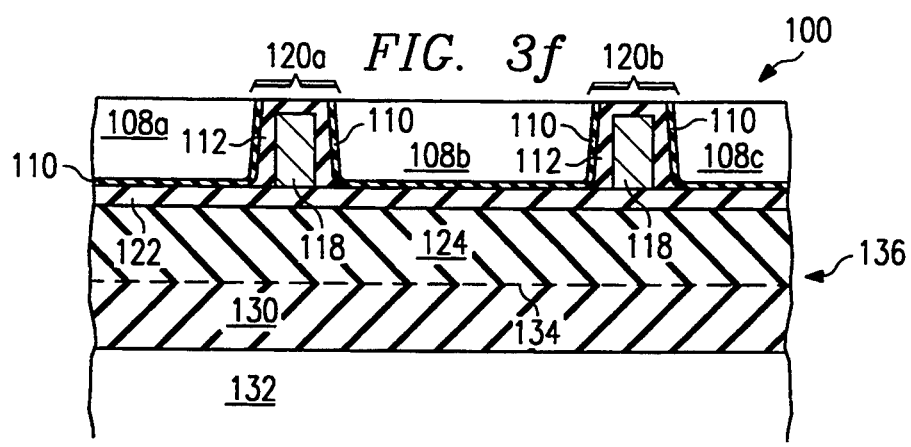
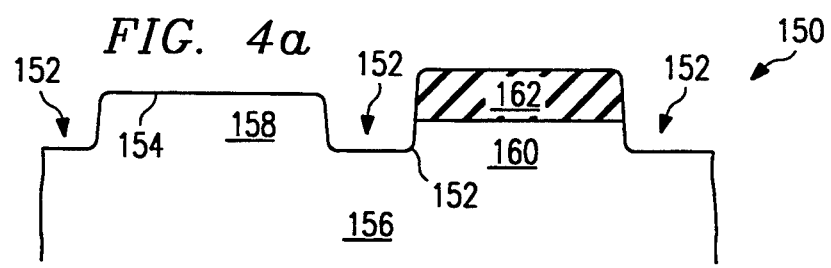
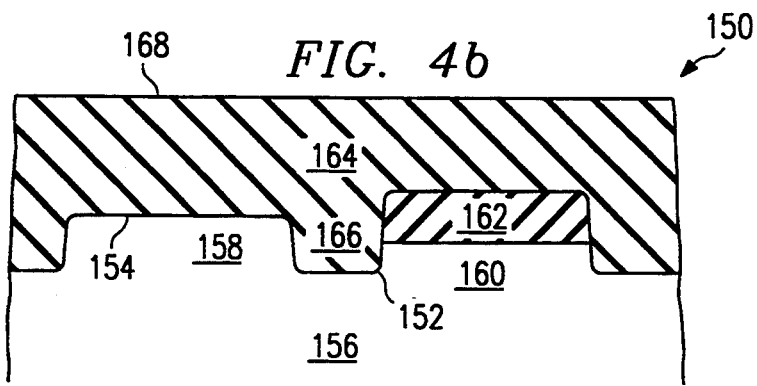
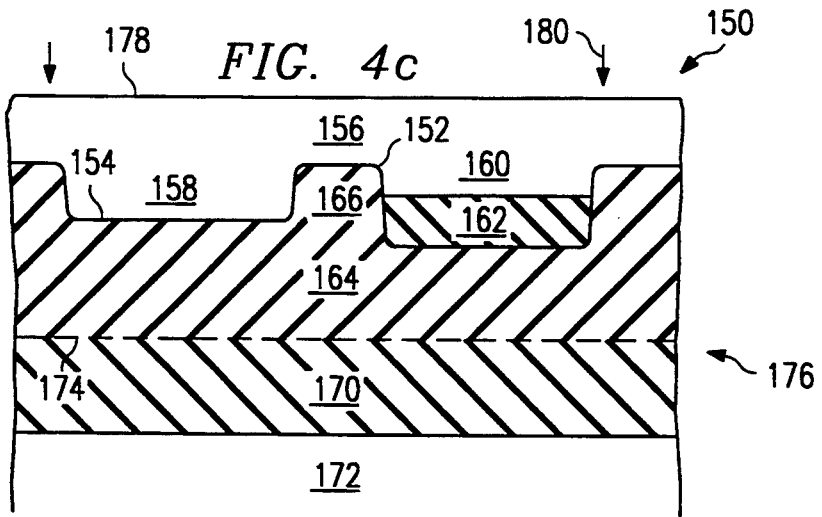

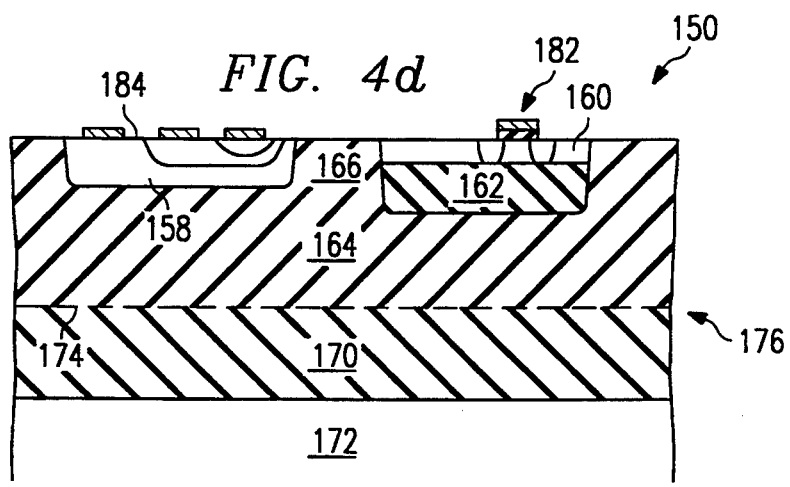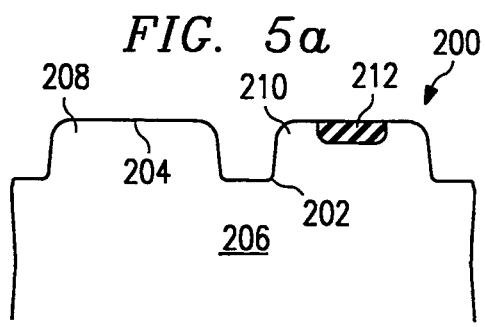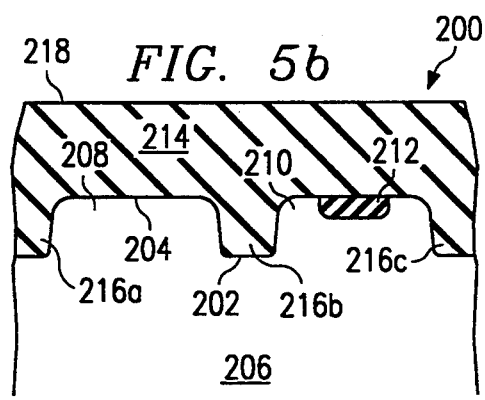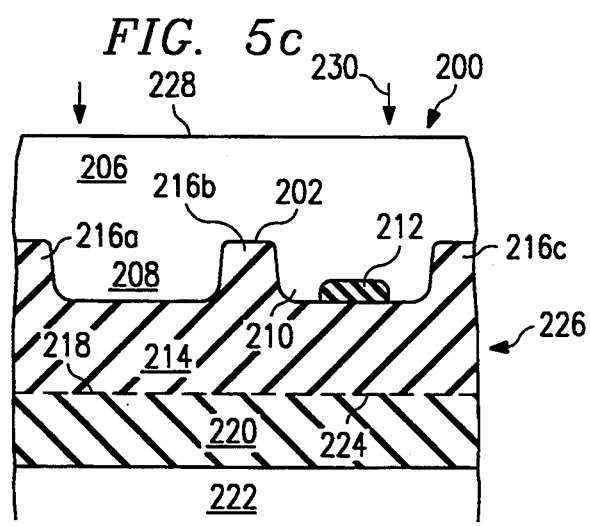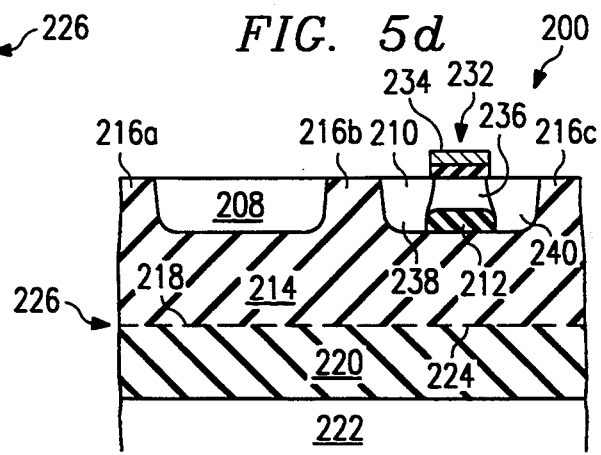

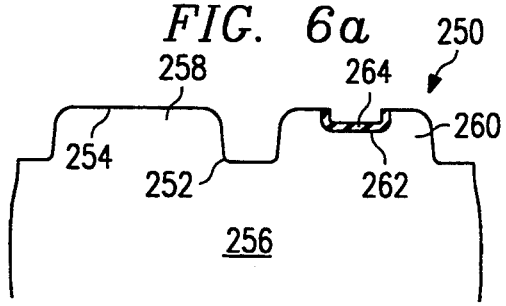
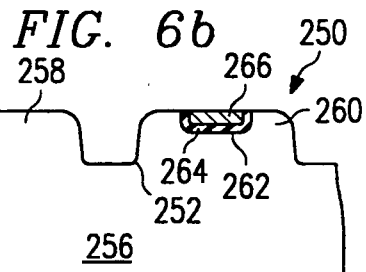
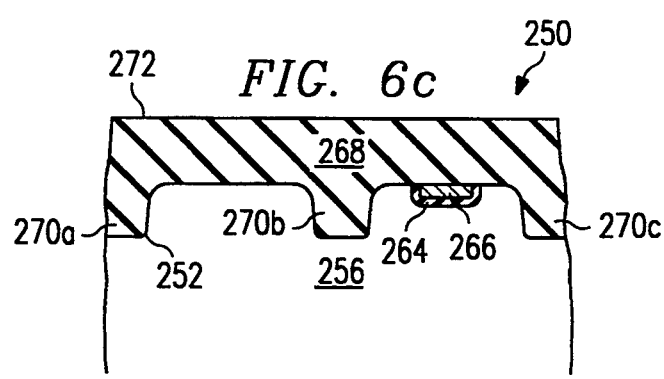
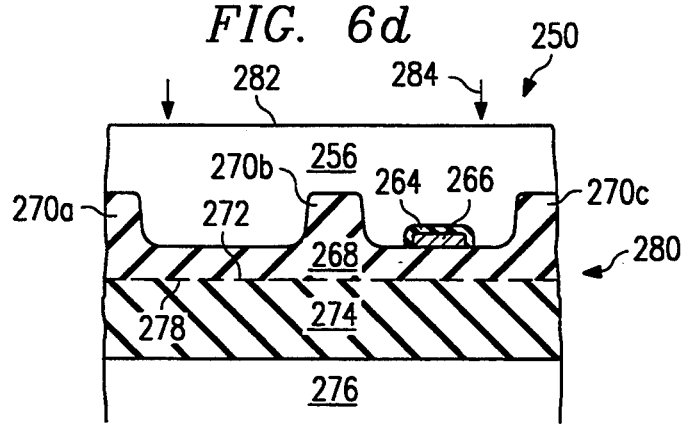
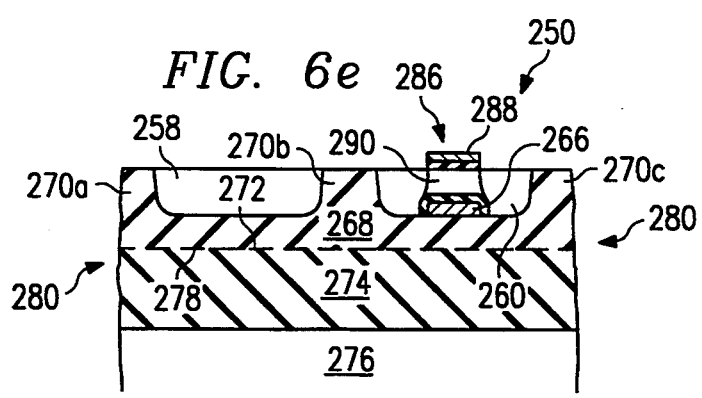

METHOD FOR FORMING A SEMICONDUCTOR ON INSULATOR DEVICE

TECHNICAL FIELD OF THE INVENTION

This invention relates in general to the field of electronic devices, and more particularly to a semiconductor on insulator device and a method for forming a semiconductor on insulator device.

BACKGROUND OF THE INVENTION

A modern method of forming integrated circuit devices involves the formation of semiconductor devices on a thin film of single crystalline semiconductor material separated from a substrate of semiconductor material by a layer of buried oxide or insulator. This is commonly referred to as semiconductor on insulator construction or SOI construction. SOI construction allows for high performance semiconductor devices due to, among other reasons, the reduction in junction capacitance between diffused areas within the devices and the substrate.

The thickness of the thin film of single crystalline semiconductor material is an important consideration in SOI construction. One method of SOI construction is called bond-and-etch-back construction or BESOI construction. Various approaches to BESOI construction are known. One method begins with two separate pieces of semiconductor material, namely, an outer semiconductor layer and a substrate. An etch stop dopant is implanted into the outer semiconductor layer. A first insulator layer is formed outwardly from the doped region of the outer semiconductor layer. A second insulator layer is formed outwardly from the semiconductor substrate. The outer semiconductor layer is then inverted such that the first insulator layer is disposed inwardly from the outer semiconductor layer. The surfaces of the first and second insulator layers are bonded by placing the surfaces together under appropriate temperature and pressure. The bonded combination of the first and second insulator layers forms a buried insulator layer separating the outer semiconductor layer from the semiconductor substrate. Finally, an exposed surface of the outer semiconductor layer opposite the buried insulator layer is etched back toward the buried insulator layer with an etchant for which the etch rate is a function of the impurity type. A thin film of semiconductor material is left disposed outwardly from the buried insulator layer with a thickness dependent in part on the depth of the original etch stop implant. According to this technique, it is difficult to control the thickness of the semiconductor film. This technique limits the processing that can be done subsequent to the etch stop implant and prior to the etch back to processes that do not cause significant diffusion of the etch stop dopant, for example, low temperature processes. It has been shown that nitridation of the interface between an oxide and a semiconductor layer improves radiation hardness. However, nitridation of the interface between the buried oxide and the outer semiconductor layer is precluded because of the effect it could have on the etch stop dopant distribution. Additionally, it is difficult to implement structures in the buried insulator layer due to alignment difficulties with devices fabricated on the semiconductor film. For example, it is sometimes desirable to make contact to the channel region of an SOI transistor. The efficiency of doing this with a buried conductor depends on the alignment accuracy of the buried conductor contact to the channel region.

Therefore, a need has arisen for a semiconductor on insulator device and a method for forming a semiconductor on insulator device that provide accurately controlled thickness of the outer semiconductor layer, allow processing of the outer semiconductor layer prior to bonding, and provide implementation of buried interconnects.

SUMMARY OF THE INVENTION

In accordance with the present invention, a semiconductor on insulator device and a method for forming a semiconductor on insulator device are provided which substantially eliminate or reduce disadvantages and problems associated with prior methods and devices.

A method for forming a semiconductor on insulator device is provided that begins with an outer semiconductor layer. Trenches of a predetermined depth are formed in the outer semiconductor layer. An insulator layer is formed outwardly from the outer semiconductor layer. A mesa having a predetermined thickness is formed by removing portions of the outer semiconductor layer to expose a working surface such that the mesa has a thickness substantially equal to the predetermined depth of the trenches after the working surface is exposed.

An important technical advantage of the present invention inheres in the fact that integrated semiconductor devices may be fabricated in a smaller area in the SOI device due to the use of buried conductors that allow connection of individual semiconductor components on multiple levels.

Another important technical advantage of the present invention inheres in the fact that selected mesas constructed according to the teachings of the present invention may be thinned to provide mesas of differing thickness having approximately coplanar surfaces. Therefore, bipolar devices requiring semiconductor thickness on the order of one micron may be formed in the same integrated semiconductor device as MOS devices requiring a layer of semiconductor material on the order of a few tenths of a micron. Additionally, a selected region of a mesa may be thinned to allow construction of a semiconductor device with a shallow channel.

Another important technical advantage of the present invention inheres in the fact that mesas constructed accordingly to the teachings of the present invention may be separated by various insulative materials to allow for use of the SOI device in a high radiation environment.

Another important technical advantage of the present invention inheres in the fact that the thickness of the thin film of single crystalline semiconductor material may be accurately controlled.

Another important technical advantage of the present invention inheres in the fact that semiconductor components fabricated in the SOI device may be easily aligned with buried conductors formed inwardly from the outer semiconductor layer and passing through the insulator layer.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIGS. 1a through 1e are cross-sectional views of successive steps for constructing a bond-and-etch-back semiconductor on insulator device (SOI device) according to the teachings of the present invention;

FIGS. 2a through 2h are cross-sectional views of successive steps for constructing an SOI device having a buried conductor according to the teachings of the present invention;

FIGS. 3a through 3f are cross-sectional views of successive steps for constructing an SOI device having isolation bodies separating individual mesas according to the teachings of the present invention;

FIGS. 4a through 4d are cross-sectional views of successive steps for constructing an SOI device where the mesas are of differing thickness according the teachings of to the present invention;

FIGS. 5a through 5d are cross-sectional views of successive steps for constructing an SOI device having a mesa with a narrow region constructed according to the teachings of the present invention; and FIGS. 6a through 6e are cross-sectional views of successive steps for constructing an SOI device having a mesa with a thinned region and a back gate constructed according to the teachings of the present invention.

DETAILED DESCRIPTION OF THE INVENTION

FIGS. 1a through 1e illustrate processing steps for the construction of an integrated semiconductor on insulator device (SOI device) according to the teachings of the present invention. The SOI device is formed using a bond-and-etch-back technique.

An integrated semiconductor device contains a multiplicity of individual semiconductor components. Consequently, an entire integrated semiconductor device is described herein by reference only to an SOI device segment indicated generally at 10. It should be understood that the complete SOI device extends to the left of, to the right of, and in a direction perpendicular to the sectional plane of SOI device segment 10 shown in FIGS. 1a through 1e.

Figure 1A:
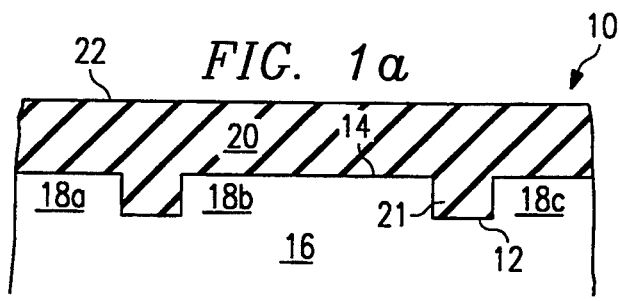

Referring to FIG. 1a, trenches 12 are etched in a surface 14 of an outer semiconductor layer 16 using conventional photolithographic and etching techniques. Semiconductor layer 16 may comprise for example, single crystalline silicon or other suitable material having semiconductor properties. Trenches 12 define mesas 18a, 18b, and 18c in surface 14. Trenches 12 may also define alignment marks in outer semiconductor layer 16 for use in later processing steps. An insulator layer 20 is formed outwardly from outer semiconductor layer 16 such that insulator layer 20 fills trenches 12 with insulative material forming isolation bodies 21a and 21b. Insulator layer 20 may comprise, for example, oxide, nitride, or other suitable dielectric material or combination of dielectric material. The dielectric material may be treated using appropriate conventional treatments, such as, nitridation. Insulator layer 20 is then planarized leaving a planarized surface 22.

Figure 1B:
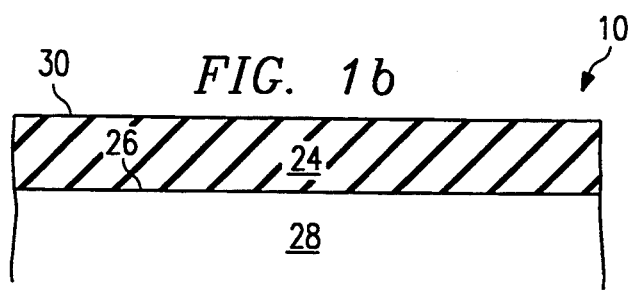

Referring to FIG. 1b, an insulator layer 24 is formed outwardly from a surface 26 of a substrate 28. Substrate 28 may comprise, for example, single crystalline silicon or other suitable material. Insulator layer 24 may comprise, for example, oxide, nitride or other suitable dielectric material or combination of dielectric material.

Insulator layer 24 is then planarized leaving a second planarized surface 30.

Figure 1C:
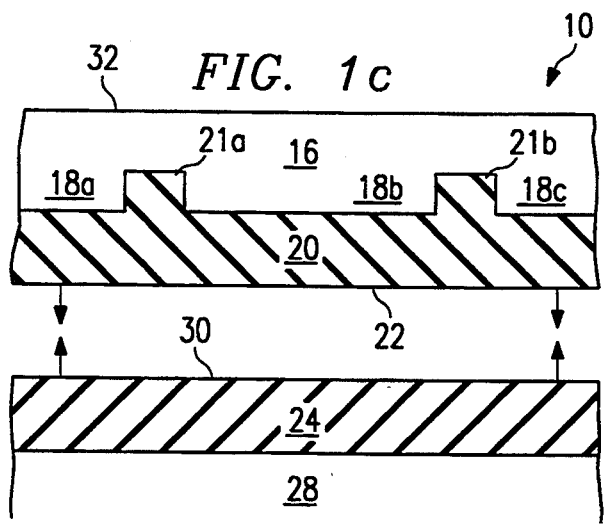

Referring to FIG. 1c, outer semiconductor layer 16 is inverted such that insulator layer 20 is disposed inwardly from outer semiconductor layer 16. Planarized surface 22 is brought in contact with planarized surface 30 under appropriate temperature and pressure to bond insulator layers 20 and 24 together.

Figure 1D:
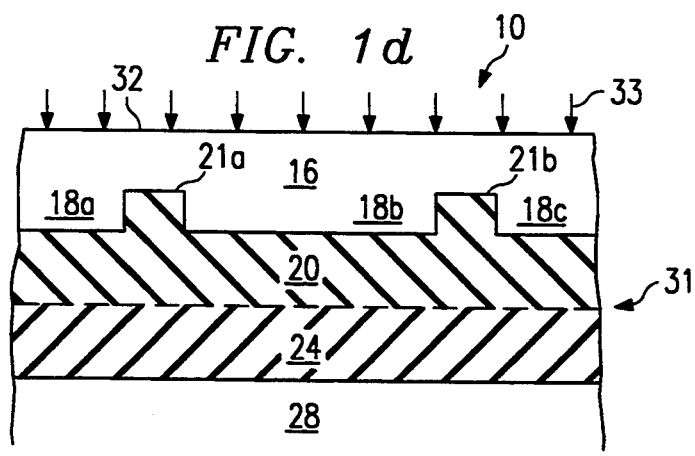

Referring to FIG. 1d, the bonded combination of the first and second insulator layers 20 and 24 forms a buried insulator layer 31 separating outer semiconductor layer 16 from substrate 28. Exposed surface 32 of outer semiconductor layer 16 is etched back toward surface 14 in the direction indicated by arrows 33 using a combination of a chemical process and a mechanical process that etches outer semiconductor layer 16 back until reaching isolation bodies 21a and 21b. In this capacity, isolation bodies 21a and 21b act as depth markers for controlling the depth of the remaining portions of outer semiconductor layer 16. For convenience, the portions of an outer semiconductor layer remaining after the outer semiconductor layer is etched back are consistently referred to as mesas independent of the configuration of the trenches 12, and even after the semiconductor material formerly supporting them has been removed. The surface of the mesa exposed by removing the supporting semiconductor material is referred to herein as a working surface in that semiconductor devices may be formed on this surface using subsequent process steps.

The etch of outer semiconductor layer 16 may be accomplished by conventional processes including, for example, the process described in K. Terada, T. Ishijima, T. Kubota, and M. Sakao, "A New DRAM Cell with a Transistor on a Lateral Epitaxial Silicon Layer (TOLE cell)" IEEE Trans. on Electron Devices, Vol. ED-37, pp. 2052–20517, 1990. Damaged portions of mesas 18a, 18b, and 18c may be removed by conventional processes including, for example, oxidation techniques. Additionally, mesas 18a, 18b, and 18c may be made more uniform by conventional processes, for example, including selective thinning techniques.

FIG. 1e illustrates the cross-sectional structure of SOI device segment 10. Individual semiconductor components 34 that may comprise, for example, an MOS transistor, a bipolar transistor, or a storage capacitor are fabricated in mesas 18a, 18b, and 18c using known processes. The process steps used to form the individual semiconductor components 34 in mesas 18a, 18b, and 18c may use alignment marks formed in the outer semiconductor layer 16 prior to bonding. Individual semiconductor components 34 housed in mesa 18b may be integrated by conductor 35. Any number of semiconductor components may be fabricated and interconnected in mesas 18a, 18b, and 18c.

FIGS. 2a through 2h illustrate processing steps for the construction of an SOI device according to the teachings of the present invention. An SOI device segment is indicated generally at 40.

Referring to FIG. 2a, trenches 42 are etched in a surface 44 of an outer semiconductor layer 46 using conventional photolithographic and etching techniques. Outer semiconductor layer 46 may comprise, for example, single crystalline silicon or other suitable material having semiconductor properties. Trenches 42 define mesas 48a, 48b, and 48c in surface 44. Trenches 42 may also define alignment marks in outer semiconductor layer 46 for use in later processing steps. An insulator layer 50 is formed outwardly from outer semiconductor layer 46 such that insulator layer 50 fills trenches 42 with insulative material forming isolation bodies 52a and 52b. Insulator layer 50 may comprise, for example, oxide, nitride, or other suitable dielectric material or combination of dielectric materials. The dielectric material may be treated using appropriate conventional treatments, such as, nitridation. Insulator layer 50 is etched back to outer semiconductor layer 46 in the direction of arrows 54. A gate insulator layer 55 of an MOS device is formed outwardly from semiconductor layer 46.

Referring to FIG. 2b, back gates 58 and 60 are formed outwardly from insulator layer 50 opposite mesas 48b and 48a respectively. Back gates 58 and 60 may comprise, for example, metal, polycrystalline silicon doped to render it conductive, or other suitable conductive material. Next, insulator layer 62 is formed outwardly from insulator layer 50 and back gates 58 and 60. Insulator layer 62 may comprise, for example, oxide, nitride, or other suitable dielectric material or combination of dielectric material. Insulator layer 62 is then planarized.

Referring to FIGS. 2c and 2d, connection trenches 64 are etched in insulator layer 62 and insulator layer 50 using conventional photolithographic and etching techniques. Buried conductor 66 is formed outwardly from insulator layer 62 such that buried conductor 66 fills the connection trenches 64. Buried conductor 66 is then planarized. Buried conductor 66 may comprise, for example, metal, polycrystalline doped to render it conductive, or other suitable conductive material.

Referring to FIG. 2e, insulator layer 68 is formed outwardly from buried conductor 66 and insulator layer 62. Insulator layer 68 may comprise, for example, oxide, nitride, or other suitable dielectric material or combination of dielectric material. Insulator layer 68 is then etched in the direction of arrows 70 leaving a planarized surface 72. For convenience, the combination of insulator layers 50, 62, and 68, buried conductor 66, and back gates 58 and 60, will be referred to collectively as insulator layer 74.

Referring to FIG. 2f, outer semiconductor layer 46 is inverted such that insulator layer 74 is disposed inwardly from outer semiconductor layer 46. An insulator layer 76 is formed outwardly from a surface 78 of substrate 80. Substrate 80 may comprise, for example, single crystalline silicon or other suitable material. Insulator layer 76 may comprise, for example, oxide, nitride, or other suitable dielectric material or combination of dielectric materials. Insulator layer 76 is planarized leaving a planarized surface 82. Next, planarized surface 82 is brought into contact with planarized surface 72 under appropriate temperature and pressure to bond the insulator layers 74 and 76 together.

Referring to FIG. 2g, the bonded combination of insulator layers 74 and 76 forms a buried insulator layer 84 separating outer semiconductor layer 46 from substrate 80. Exposed surface 86 of outer semiconductor layer 46 is etched back toward surface 44 in the direction indicated by arrows 88 using a suitable combination of a chemical process and a mechanical process such as the process referred to above with respect to FIG. 1d until reaching isolation bodies 52a and 52b. In this capacity, isolation bodies 52a and 52b act as depth markers for controlling the depth of the remaining portions of outer semiconductor layer 46. For convenience, the portions of the outer semiconductor layer 46 remaining after the outer semiconductor layer 46 is etched back are consistently referred to as mesas 48a, 48b, and 48c even after the semiconductor material formerly supporting them has been removed. Damaged portions of mesas 48a, 48b, and 48c may be removed by conventional processes including, for example, oxidation techniques. Additionally, mesas 48a, 48b, and 48c may be made more uniform by conventional processes including, for example, selective thinning techniques.

FIG. 2h illustrates the cross-sectional structure of SOI device segment 40. First semiconductor component 90 is fabricated in the mesa 48b using known processes. First semiconductor component 90 may comprise, for example, a first MOS transistor. A second semiconductor component 92 is fabricated in mesa 48c using known processes. Second semiconductor component 92 may comprise, for example, a second MOS transistor. Alignment marks etched in surface 44 of outer semiconductor layer 46 may be used to align first and second semiconductor components 90 and 92 with buried conductor 66 and back gate 58.

While a particular sequence of steps for forming a buried conductor is illustrated in FIGS. 2a through 2h, this is not meant to be restrictive. Suitable integrated circuit techniques and sequences may be used in the formation of buried conductors, including gate formation, without degrading the effectiveness of the trench depth markers. Selected levels of buried gate and buried conductor formation can be aligned to the depth trench markers, and thus can be formed within one alignment tolerance of the mesa pattern.

FIGS. 3a through 3f illustrate processing steps for the construction of an SOI device according to the teachings of the present invention. An SOI device segment is indicated generally at 100. Referring to FIG. 3a, trenches 102 are etched in a surface 104 of an outer semiconductor layer 106 using conventional photolithographic and etching techniques. Outer semiconductor layer 106 may comprise, for example, single crystalline silicon or other suitable material having semiconductor properties. Trenches 102 define mesas 108a, 108b, and 108c in surface 104. Trenches 102 may also define alignment marks in outer semiconductor layer 106 for use in later processing steps. An oxide layer 110 is formed outwardly from outer semiconductor layer 106 such that oxide layer 110 covers surface 104 of outer semiconductor layer 106 and trenches 102. A second dielectric layer 112 is formed outwardly from oxide layer 110. Second dielectric layer 112 may comprise, for example, a differently doped oxide such as phosphosilicate glass (PSG). The combination of a thin grown oxide and a thick deposited PSG layer has been shown to have superior radiation hardness by K. Kasama et. al. "A Radiation-Hard Insulator for MOS LSI Device Isolation" IEEE Trans. on Nuclear Science, Vol. NS-32, 1985 pp 3965-3974. Dual dielectric may also be used for improved dielectric integrity.

Referring to FIG. 3b, a polycrystalline silicon layer 114 is formed outwardly from second dielectric layer 112. Polycrystalline silicon layer 114 is doped to render it conductive. Polycrystalline silicon layer 114 is etched in the direction of arrows 116 using known processes until reaching oxide layer 110. Optionally, second dielectric layer 112 can be left unetched.

Referring to FIG. 3c, the remaining portion of polycrystalline silicon layer 114 comprises polycrystalline silicon bodies 118. Mesas 108a, 108b, and 108c are separated by isolation bodies 120a and 120b. Isolation bodies 120a and 120b comprise oxide layer 110, second dielectric layer 112, and polycrystalline silicon body 118.

Referring to FIG. 3d, a third dielectric layer 122 is formed outwardly from oxide layer 110 and isolation bodies 120a and 120b. A fourth dielectric layer 124 is formed outwardly from third dielectric layer 122. Fourth dielectric layer 124 is then planarized leaving a planarized surface 126. For convenience, the combination of oxide layer 110, isolation bodies 120a and 120b, third dielectric layer 122, and fourth dielectric layer 124, will be referred to collectively as insulator layer 128.

Referring to FIG. 3e, outer semiconductor layer 106 is inverted such that insulator layer 128 is disposed inwardly from outer semiconductor layer 106. An insulator layer 130 is formed outwardly from a substrate 132. Substrate 132 may comprise, for example, single crystalline silicon or other suitable material. Insulator layer 130 may comprise, for example, oxide, nitride, or other suitable dielectric material or combination of dielectric materials. Insulator layer 130 is planarized leaving planarized surface 134. Planarized surface 126 is brought in contact with planarized surface 134 under appropriate temperature and pressure to bond insulator layers 128 and 130 together. The bonded combination of insulator layers 128 and 130 forms a buried insulator layer 136 separating outer semiconductor layer 106 from substrate 132. Exposed surface 138 of outer semiconductor layer 106 is etched back toward insulator layer 136 in the direction indicated by arrows 140 using a suitable combination of a chemical process and a mechanical process such as the process referred to above with respect to FIGS. 1d until reaching isolation bodies 120a and 120b. In this capacity, isolation bodies 120a and 120b act as depth markers for controlling the depth of the remaining portions of outer semiconductor layer 106. For convenience, the remaining portions of outer semiconductor layer 106 illustrated in FIG. 3f are consistently referred to as mesas 108a, 108b, and 108c even after the semiconductor material formerly supporting them has been removed. Damaged portions of mesas 108a, 108b, and 108c may be removed by conventional processes including, for example, oxidation techniques. Additionally, mesas 108a, 108b, and 108c may be made more uniform by conventional processes including, for example, selective thinning techniques.

In operation, SOI device segment 100 is useful in high radiation environments. Isolation bodies 120a and 120b prevent radiation induced conduction in and between mesas 108a, 108b, and 108c.

FIG. 4a through 4d illustrate processing steps for the construction of an SOI device according to the teachings of the present invention. An SOI device segment is indicated generally at 150. Referring to FIG. 4a, trenches 152 are etched in a surface 154 of an outer semiconductor layer 156 using conventional photolithographic and etching techniques. Outer semiconductor layer 156 may comprise, for example, single crystalline silicon or other suitable material having semiconductor properties. Trenches 152 define mesas 158 and 160. Trenches 152 may also define alignment marks in outer semiconductor layer 156 for use in later processing steps. Mesa 160 is thinned by selectively growing an insulator 162 outwardly from mesa 160 using conventional photolithographic and, for example, oxidation techniques.

Referring to FIG. 4b, an insulator layer 164 is formed outwardly from outer semiconductor layer 156 such that insulator layer 164 fills trenches 152 with insulative material forming isolation bodies 166. Insulator layer 164 may comprise, for example, oxide, nitride, or other suitable dielectric material or combination of dielectric materials. The dielectric material may be treated using appropriate conventional treatments, such as nitridation. Insulator layer 164 is then planarized leaving a planarized surface 168.

Referring to FIG. 4c, outer semiconductor layer 156 is inverted such that insulator layer 164 is disposed inwardly from outer semiconductor layer 156. An insulator layer 170 is formed outwardly from a substrate 172. Substrate 172 may comprise, for example, single crystalline silicon or other suitable material. Insulator layer 170 may comprise, for example, oxide, nitride, or other suitable dielectric material or combination of dielectric materials. Insulator layer 170 is planarized leaving planarized surface 174. Planarized surface 174 is brought in contact with planarized surface 168 under appropriate temperature and pressure to bond insulator layers 170 and 164 together. The bonded combination of insulator layer 164 and insulator layer 170 form a buried insulator layer 176 separating outer semiconductor layer 156 from substrate 172. Exposed surface 178 of outer semiconductor layer 156 is etched back toward insulator layer 176 in the direction indicated by arrows 180 using a suitable combination of a chemical process and a mechanical process such as the process referred to above with respect to FIG. 1d until reaching isolation bodies 166. In this capacity, isolation bodies 166 act as depth marker controlling the depth of the remaining portions of outer semiconductor layer 156. For convenience, the remaining portions of outer semiconductor layer 156 are consistently referred to as mesas 158 and 160 even after the semiconductor material supporting them has been removed. Damaged portions of mesas 158 and 160 may be removed by conventional processes including, for example, oxidation techniques. Additionally, mesas 158 and 160 may be made more uniform by conventional processes including, for example, selective thinning.

FIG. 4d illustrates the cross-sectional structure of SOI device segment 150. An MOS transistor 182 is fabricated in mesa 160 using known processes and a bipolar transistor 184 is fabricated in mesa 158 according to known processes. It should be understood that multiple semiconductor components may be fabricated in mesas 158 and 160. The process steps used to form MOS transistor 182 and bipolar transistor 184 may use alignment marks formed in the outer semiconductor layer 156 prior to bonding.

An important technical advantage of the present invention inheres in the fact that mesas 158 and 160 of SOI device segment 150 have differing thicknesses and provide an approximately planar surface allowing fabrication using bipolar and MOS technologies in a single integrated semiconductor device. Mesa 158 may be interconnected with mesa 160 using the techniques described in association with FIGS. 2a through 2h.

FIG. 5a through 5d illustrate processing steps for construction of an SOI device according to the teachings of the present invention. An SOI device segment is indicated generally at 200. Referring to FIG. 5a, trenches 202 are etched in a surface 204 of an outer semiconductor layer 206 using conventional photolithographic and etching techniques. Outer semiconductor layer 206 may comprise, for example, single crystalline silicon or other suitable material having semiconductor properties. Trenches 202 define mesas 208 and 210. Trenches 202 may also define alignment marks in outer semiconductor layer 206 for use in later processing steps. A region of mesa 210 is thinned by selectively growing an insulator 212 on mesa 210 using conventional photolithographic and, for example, oxidation techniques.

Referring to FIG. 5b, an insulator layer 214 is formed outwardly from outer semiconductor layer 206 such that insulator layer 214 fills trenches 202 with insulative material forming isolation bodies 216a, 216b, and 216c. Insulator layer 214 may comprise, for example, oxide, nitride, or other suitable dielectric material or combination of dielectric materials. The dielectric materials may be treated using appropriate conventional treatments, such as, nitridation. Insulator layer 214 is planarized leaving a planarized surface 218.

Referring to FIG. 5c, outer semiconductor layer 206 is inverted such that insulator layer 214 is disposed inwardly from outer semiconductor layer 206. Insulator layer 220 is formed outwardly from substrate 222. Insulator layer 220 is planarized leaving a planarized surface 224. Planarized surface 224 is brought in contact with planarized surface 218 under appropriate temperature and pressure to bond insulator layers 220 and 214 together. The bonded combination of insulator layer 220 and insulator layer 214 forms a buried insulator layer 226 separating outer semiconductor layer 206 from substrate 222. Exposed surface 230 of outer semiconductor layer 206 is etched back toward buried insulator layer 226 in the direction indicated by arrows 230 using a suitable combination of a chemical process and a mechanical process such as the process referred to above with respect to FIG. 1d until reaching isolation bodies 216a, 216b, and 216c. In this capacity, isolation bodies 216a, 216b, and 216c act as depth markers controlling the depth of the remaining portions of outer semiconductor layer 206. For convenience, the remaining portions of outer semiconductor layer 206 are consistently referred to as mesas 208 and 210 even after the semiconductor material supporting them has been removed. Damaged portions of mesas 208 and 210 may be removed by conventional processes including, for example, oxidation techniques. Additionally, mesas 208 and 210 may be made more uniform by conventional processes including, for example, selective thinning techniques.

FIG. 5d illustrates the cross-sectional structure of SOI device segment 200. An MOS transistor 232 is fabricated in mesa 210 using known processes. MOS transistor 232 is fabricated such that gate 234 is disposed outwardly from mesa 210 directly opposite insulator 212. The process steps used to form the MOS transistor 232 in mesa 210 may use alignment marks formed in outer semiconductor layer 206 prior to bonding.

It is a technical advantage of the present invention to allow construction of an MOS device having a narrow channel 236 that may be depleted more easily than a channel of a conventional MOS device. It is another technical advantage of the present invention that MOS transistor 232 is fabricated having a deep source region 238 and a deep drain region 240. The deep source region 236 and the deep drain region 240 provide high conductance and provide regions that are more likely to create a good contact with a conductive interconnect.

FIG. 6a through 6e illustrate processing steps for the construction of an SOI device according to the teachings of the present invention. An SOI device segment is indicated generally at 250. Referring to FIG. 6a, trenches 252 are etched in a surface 254 of outer semiconductor layer 256 using conventional photolithographic and etching techniques. Outer semiconductor layer 256 may comprise, for example, single crystalline silicon or other suitable material having semiconductor properties. Trenches 252 define mesas 258 and 260 in surface 254. Trenches 252 may also define alignment marks in outer semiconductor layer 256 for use in later processing steps. A trench 262 is etched in mesa 260 using conventional photolithographic and etching techniques. An insulator layer 264 is formed outwardly from trench 262.

Referring to FIG. 6b, a back gate 266 is deposited outwardly from insulator layer 264 using conventional photolithographic and etching techniques. Back gate 266 may comprise for example, metal, polycrystalline silicon doped to render it conductive, or other suitable conductive material.

Referring to FIG. 6c, an insulator layer 268 is formed outwardly from outer semiconductor layer 256 such that insulator layer 268 fills trenches 252 with insulative material forming isolation bodies 270a, 270b, and 270c. Insulator layer 268 is planarized leaving planarized surface 272.

Referring to FIG. 6d, outer semiconductor layer 256 is inverted such that insulator layer 268 is disposed inwardly from outer semiconductor layer 256. An insulator layer 274 is formed outwardly from a substrate 276. Substrate 276 may comprise, for example, single crystalline silicon or other suitable material. Insulator layer 274 is then planarized leaving a planarized surface 278. Planarized surface 278 is brought in contact with planarized surface 272 under appropriate temperature and pressure to bond insulator layers 274 and 268 together. The bonded combination of insulator layers 268 and 274 forms a buried insulator layer 280 separating outer semiconductor layer 256 from substrate 276. Exposed surface 282 is etched back toward insulator layer 280 in the direction indicated by arrows 284 using a suitable combination of a chemical process and a mechanical process such as the process referred to above with respect to FIG. 1d until reaching isolation bodies 270a, 270b, and 270c. In this capacity, isolation bodies 270a, 270b, and 270c act as depth markers controlling the depth of the remaining portions of outer semiconductor layer 256. For convenience, the remaining portions of outer semiconductor layer 256 are consistently referred to as mesas 258 and 260 even after the semiconductor material supporting them has been removed. Damaged portions of mesas 258 and 260 may be removed by conventional processes including, for example, oxidation techniques. Additionally, mesas 258 and 260 may be made more uniform by conventional processes including, for example, selective thinning techniques.

FIG. 6e illustrates the cross-sectional structure of SOI device segment 250. An MOS transistor 286 is fabricated in mesa 260 according to known processes such that the gate 288 of MOS device 286 is fabricated outwardly from mesa 260 opposite back gate 266. The process steps used to form the MOS transistor 286 may use alignment marks formed in outer semiconductor layer 256 prior to bonding.

In operation, back gate 266 allows additional control of the channel 290 of MOS transistor 286. As described with respect to FIG. 2, a buried interconnect may be coupled to back gate 266 to control the depletion of channel 290. As shown in FIG. 6e, back gate 266 comprises a floating gate.

Although the present invention and its advantages have been described in detail, it should be understood that various changes, substitutions and alterations can be made herein without departing from the spirit and scope of the invention as defined solely by the appended claims. For example, the bonded substrate may be replaced by a deposited polysilicon layer, or a dielectric layer thick enough to provide mechanical stability. If the bonded substrate approach is used as described, a variety of substrate materials could be used, including single crystal silicon, single crystal silicon with a dielectric layer, polysilicon, polysilicon with a dielectric layer, or sapphire. In the above, the dielectric material could comprise multiple layers of different materials.

This technique can be used in conjunction with other methods. For example, a mechanical polish could be used prior to the etch comprising a combination of a chemical process and a mechanical process. A dopant etch stop could be used in conjunction with the trench markers, with the dopant etch stop used for an initial depth stop and the trench marker for a refined depth stop. Alternatively, the trench marker may comprise the initial depth stop and the dopant etch stop may comprise the refined depth stop. Finally, the trench marker and dopant etch stop could be used in combination for demarkation of the same depth.

What is claimed is:

1. A method for forming an electronic device, comprising the steps of:
    forming trenches in an outer semiconductor layer;
    forming an insulator layer outwardly from the outer semiconductor layer;
    forming a buried conductor within said insulator layer and extending through said insulator layer to said outer semiconductor layer; and
    creating a mesa having a thickness by removing portions of the outer semiconductor layer from a side opposite said insulator layer to expose a working surface, the trenches formed to have a depth such that the thickness of the mesa is substantially equal to the depth of the trenches after the working surface is exposed.

2. The method of claim 1, further comprising the step of bonding the insulator layer with a substrate by placing a surface of the insulator layer in contact with a surface of the substrate.

3. The method of claim 2, and further comprising the step of planarizing the insulator layer prior to the step of bonding.

4. The method of claim 1, wherein the step of forming an insulator layer comprises the step of forming an oxide layer outwardly from the outer semiconductor layer.

5. The method of claim 4, wherein the step of forming an oxide layer further comprises the step of nitridation of the oxide layer.

6. The method of claim 1, wherein the step of forming an insulator layer comprises the step of forming multiple levels of dielectric material.

7. The method of claim 1, wherein the step of creating a mesa comprises the step of removing portions of the outer semiconductor layer from a side opposite said insulator layer to expose the working surface by etching the side opposite said insulator layer an exposed surface of the outer semiconductor layer using a combined chemical and mechanical process.

8. The method of claim 2, and further comprising the step of forming a second insulator layer outwardly from the substrate prior to the step of bonding.

9. The method of claim 8, and further comprising the step of planarizing the second insulator layer prior to the step of bonding.

10. The method of claim 1, and further comprising the step of removing damaged semiconductor material from the working surface subsequent to the step of creating a mesa.

11. The method of claim 1, and further comprising the step of oxidizing a portion of said outer semiconductor layer between said trenches prior to said step of forming said insulator layer such that after said step of creating the mesa, the mesa comprises a substantially uniform surface.

12. The method of claim 1, wherein the step of forming trenches comprises the step of forming an alignment mark in the outer semiconductor layer for aligning semiconductor components with the buried conductor.

13. The method of claim 1, and further comprising the step of fabricating individual semiconductor components in the mesa.

14. A method for forming an SOI device, comprising the steps of:
    forming trenches to define and to isolate a plurality of mesas in an outer semiconductor layer;
    forming an insulator layer outwardly from the outer semiconductor layer;
    removing portions of the outer semiconductor layer from a side opposite said insulator layer to expose a working surface, the trenches formed to have a depth such that the mesas have a thickness substantially equal to the depth of the trenches after the working surface is exposed; and
    thinning selected mesas to form mesas of different thicknesses prior to the step of forming an insulator layer such that the mesas having different thicknesses provide a substantially co-planar working surface after the working surface is exposed.

15. The method of claim 22, and further comprising the step of planarizing the insulator layer prior to the step of bonding.

16. The method of claim 14, wherein the step of forming an insulator layer comprises the step of forming an oxide layer outwardly from the outer semiconductor layer.

17. The method of claim 14, wherein said step of forming an insulator layer comprises the steps of:
    forming an oxide layer outwardly from the outer semiconductor layer; and
    forming a first dielectric layer outwardly from the oxide layer.

18. The method of claim 17, wherein said step of forming an insulator layer further comprises the steps of:
    forming a polycrystalline silicon body outwardly from the second dielectric layer; and
    forming an insulator layer outwardly from the polycrystalline silicon body.

19. The method of claim 14, wherein the step of removing portions of the outer semiconductor layer from a side opposite said insulator layer comprises the step of etching an exposed surface of the outer semiconductor layer using a combined chemical and mechanical process.

20. The method of claim 14, and further comprising the step of forming at least one back gate disposed in the insulator layer.

21. The method of claim 20, and further comprising the step of forming at least one buried conductor disposed inwardly from the outer semiconductor layer and passing through the insulator layer operable to connect to at least one back gate.

22. The method of claim 14, further comprising the step of bonding the insulator layer with a substrate by placing the surface of the insulator layer together with a surface of the substrate.

23. The method of claim 22, and further comprising the step of forming a second insulator layer outwardly from the substrate prior to the step of bonding.

24. The method of claim 23, and further comprising the step of planarizing the second insulator layer prior to the step of bonding.

25. The method of claim 14, and further comprising the step of forming a buried conductor adjacent said insulator layer and passing through the insulator layer and forming a semiconductor component in one of the mesas such that said semiconductor component is connected to said buried conductor.

26. The method of claim 25, wherein the step of forming trenches comprises the step of forming an alignment mark in the outer semiconductor layer for aligning the semiconductor components with the buried conductor.

27. The method of claim 14, wherein the step of thinning selected mesas comprises the step of oxidizing at least one selected region of a selected mesa.

28. The method of claim 14, wherein the step of thinning selected mesas comprises the step of etching at least one selected region of a selected mesa.

29. The method of claim 14, wherein the step of thinning selected mesas forms at least one thinned channel region and further comprising the step of forming a back gate in at least one of the thinned channel region of a selected mesa operable to influence operation of the selected thinned channel region.

30. The method of claim 29, and further comprising the step of forming at least one buried conductor disposed inwardly from the outer semiconductor layer and passing through the insulator layer operable to connect to at least one back gate.

31. The method of claim 14, and further comprising the step of fabricating individual semiconductor components in the mesas of the outer semiconductor layer.

32. A method for forming an SOI device, comprising the steps of:
forming trenches to define and to isolate a plurality of mesas and to define alignment marks in an outer semiconductor layer;
forming thinned channel regions by thinning selected regions of selected mesas;
forming an oxide layer outwardly from the outer semiconductor layer;
forming a plurality of back gates disposed in the oxide layer outwardly from selected mesas;
forming a plurality of buried conductors outwardly from the plurality of mesas and passing through the oxide layer to the outer semiconductor layer;
planarizing the oxide layer;
providing a substrate adjacent said planarized oxide layer;
removing portions of the outer semiconductor layer to expose a working surface, the trenches formed to have a depth such that the mesas have a thickness substantially equal to the depth of the trenches after the working surface is exposed;
thinning selected mesas such that selected mesas formed to have different thicknesses provide a substantially coplanar working surface after the working surface is exposed;
fabricating individual semiconductor components in the working surface of the plurality of mesas; and
coupling selected semiconductor components and selected back gates to selected buried conductors.

33. The method of claim 32, wherein the step of providing a substrate comprises the step of bonding the planarized oxide layer with a substrate by placing the planarized surface together with a surface of the substrate.

34. A method of forming a silicon-on-insulator structure, comprising the steps of:
forming a plurality of mesas in an outer semiconductor layer from a first side;
thinning selected ones of said plurality of mesas;
forming an insulator layer on said first side of said outer semiconductor layer, said insulator layer filling the area between said mesas;
removing portions of the outer semiconductor layer from a second side to create a working surface, wherein said working surface is substantially planar and
forming a MOS transistor in one of said thinned mesas and forming a bipolar transistor in one of said mesas that was not thinned.

35. The method of claim 34, wherein the step of thinning selected ones of said plurality of mesas comprises the step of oxidizing said selected ones of said mesas.

36. A method of forming a silicon-on-insulator structure, comprising the steps of:
forming a plurality of mesas in an outer semiconductor layer from a first side;
forming a first insulator layer on said first side of said outer semiconductor layer, said first insulator layer filling the area between said mesas;
forming a buried conductor adjacent said first insulator layer and extending through a portion of said first insulator layer to one of said mesas;
forming an alignment mark in the outer semiconductor layer for aligning semiconductor components with the buried conductor; and
removing portions of the outer semiconductor layer from a second side to create a working surface, wherein said working surface is substantially planar.

37. The method of claim 36, further comprising the steps of:
forming a second insulator layer adjacent said buried conductor; and
bonding the second insulator layer with a substrate by placing the second insulator layer together with a surface of the substrate after said step of forming said alignment mark.

* * * * *